(12) United States Patent
Aoki et al.

(10) Patent No.: US 6,700,910 B1
(45) Date of Patent: Mar. 2, 2004

(54) WAVELENGTH TUNABLE LASER AND OPTICAL DEVICE

(75) Inventors: Masahiro Aoki, Kokubunji (JP);
Shinya Sasaki, Koganei (JP);
Tomonobu Tsuchiya, Hachioji (JP);
Hiroyuki Gomyo, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/503,740

(22) Filed: Feb. 15, 2000

(30) Foreign Application Priority Data

Apr. 7, 1999 (JP) .......................... 11-099583

(51) Int. Cl.⁷ ............................ H01S 5/00
(52) U.S. Cl. ...................... 372/43; 372/20; 372/26; 372/36; 372/38; 372/48; 372/50; 372/96; 359/114; 359/115; 359/151
(58) Field of Search .............. 372/43, 20, 36, 372/38, 50, 48, 26, 96; 359/114, 115, 151

(56) References Cited

U.S. PATENT DOCUMENTS

| | | | | |
|---|---|---|---|---|
| 5,341,391 A | * | 8/1994 | Ishimura ...................... | 372/46 |
| 5,402,435 A | * | 3/1995 | Shiono et al. ................ | 372/43 |
| 5,536,085 A | * | 7/1996 | Li et al. ........................ | 372/50 |
| 5,960,014 A | * | 9/1999 | Li et al. ........................ | 372/20 |
| 6,040,590 A | * | 3/2000 | OBrien et al. ................ | 257/94 |
| 6,404,793 B1 | * | 6/2002 | Merritt ......................... | 372/50 |

FOREIGN PATENT DOCUMENTS

| | | |
|---|---|---|
| JP | 6-112570 | 4/1994 |
| JP | 10-506724 | 4/1996 |
| JP | 9-270568 | 10/1997 |

OTHER PUBLICATIONS

Gabriela Telipan, Emil Bodea, Camelia Petrescu, Mihia Motataianu, "A thick film semiconductor NOx detector", IEEE, 1997, pate 527–530.*
D. Mutscall, C. Scheibe, E. Obermeier, "Basic micro module for chemical sensors with on chip heater and buried sensor structure", Transducers '95, p. 256–259.*
Guoli Lu, Wei Wang., "Wavelength tunable electroabsorption Modulated DFB Laser with thin film heater" IEEE, p. 504–505.*
H. Mori, S. Onobori, J. Ono, "Broad range continuos wavelenght tuning characteristics of DBR lasers employing passive–section heaters", SCL4.3, p. 262–263.*
S. Sakano et al, "Tunable DFB Laser with a Striped Thin–Film Heater", IEEE Photonics Technology Letters, vol. 4, No. 4, Apr. 1992, pp. 321–323.

* cited by examiner

*Primary Examiner*—Paul Ip
*Assistant Examiner*—Delma R. Flores-Ruiz
(74) *Attorney, Agent, or Firm*—Mattingly, Stanger & Malur, P.C.

(57) ABSTRACT

In order to form a wavelength tunable laser capable of tuning a wave over a wide range by simple control means, a thin film heater is mounted either over an upper electrode of a ridge waveguide semiconductor laser having ridge waveguides on a semiconductor substrate or over the semiconductor substrate and on both sides of the ridge waveguide with a gap of a few $\mu$m. By controlling a current passed to the thin film heater, the oscillation wavelength of the semiconductor laser is tuned. In the case where the thin film heater is mounted over an upper electrode of a ridge waveguide, a nonconductor is formed on both sides of the ridge conductor to more efficiently enable heat from the heater to reach an active layer of the ridge waveguide more efficiently.

12 Claims, 7 Drawing Sheets

WAVELENGTH TUNABLE LASER AND OPTICAL DEVICE

BACKGROUND OF THE INVENTION

The present invention relates to a wavelength tunable laser and an optical device using the wavelength tunable laser. More particularly, the invention relates to a semiconductor laser capable of tuning a lasing wavelength over a wide range, an optical modulator using the semiconductor laser, and a wavelength-division multiplexing transmission system employing, as a light source, a semiconductor laser used for a wavelength-division multiplexing optical system for multiplexing a plurality of different signal light and transmitting the multiplexed signal.

One of the important techniques in a wavelength-division multiplexing optical system is management of a wavelength of a light source of each of a plurality of channels. In the present optical communication systems, in order to maintain the wavelength of the light source at a predetermined value, a wavelength monitor and means for stabilizing the wavelength of the light source by feedback are provided for each channel and a spare light source prepared for a failure is provided for each of all of the channels. The number of related electronic devices therefore increases according to the number of channels. It is also necessary to control each semiconductor laser so that its lasing wavelength is within a predetermined narrow wavelength band. It is consequently difficult to improve the manufacturing yield. Such issues interfere with the attempt to achieve miniaturization and reduction in cost of an optical transmission system and are significant issues in the case of further narrowing the interval between waves of channels or the case of increasing the number of channels.

On the other hand, there is an idea such that the lasing wavelengths necessary for a plurality of channels are covered by a single backup light source by using a lasing wavelength tunable semiconductor laser. In this case, a wavelength tunable semiconductor laser capable of easily and successively sweeping the lasing wavelength is necessary, but has not been realized until now.

In particular, in an optical multiplexing transmission of a long distance, it is necessary to realize the system in a form that an optical modulator is monolithically integrated by which chirping can be reduced. In a monolithic integrated light source in which an optical modulator is incorporated, by adjusting the temperature of the whole light modulator, the wavelength of a channel can be adjusted. Presently, however, the operating temperature range of the monolithic integrated optical modulator is as narrow as ±5 degrees centigrade. The width of the wavelength which can be swept in practice is therefore only about 0.5 nm.

Figure 9:
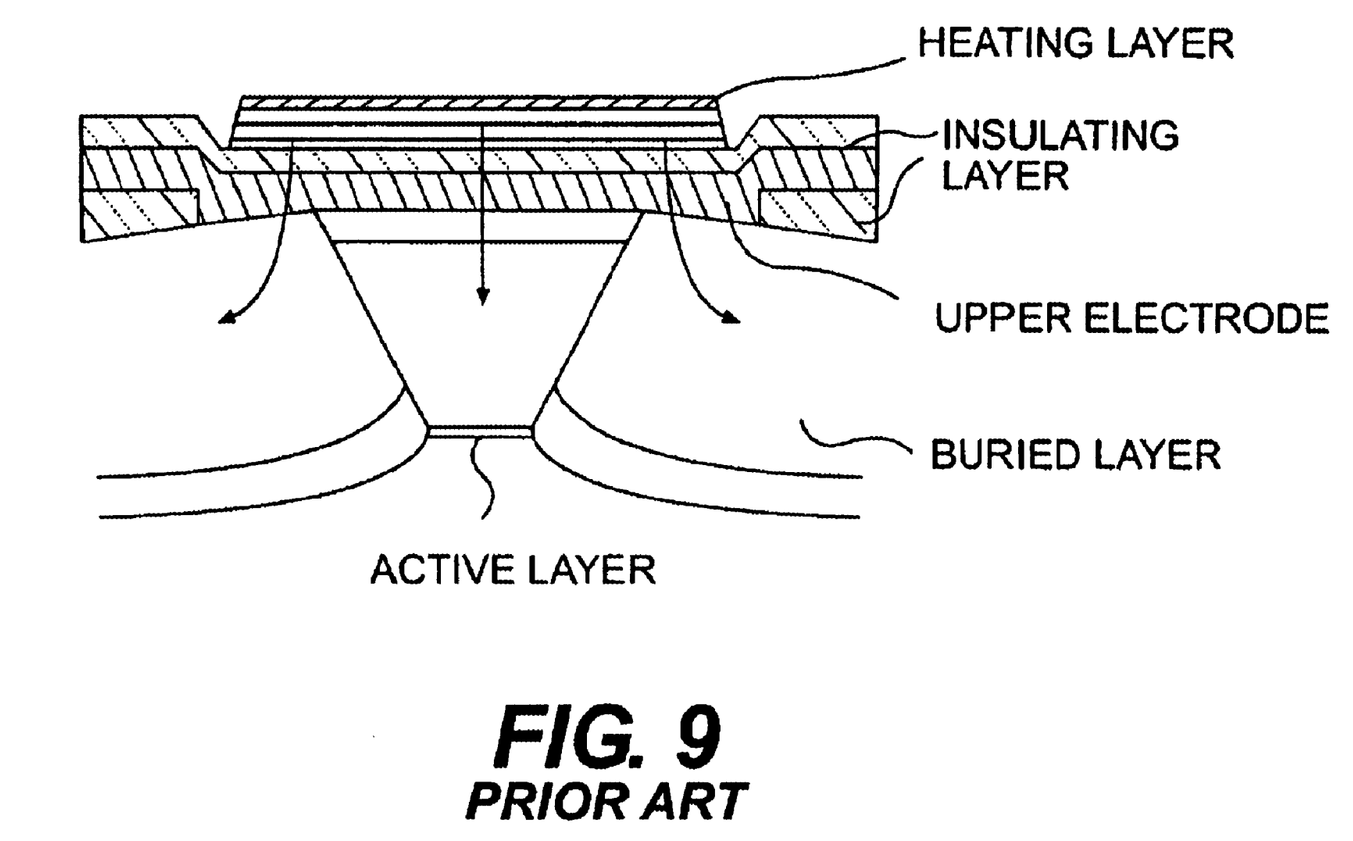
FIG. 9 is a cross section of a wavelength tunable laser which is a conventionally known buried semiconductor laser.

FIG. 9 shows the configuration in cross section of a wavelength tunable semiconductor laser capable of easily and successively sweeping the wavelength, in which a heater electrode is attached to a conventional buried heterostructure semiconductor laser. (For example, a technique described in IEEE Photonics Technology Letters, Vol. 4, p. 321, 1992 can be mentioned as a wavelength-division multiplexing system light source of this kind). According to the technique, a heater layer is formed over an upper electrode of a buried heterostructure semiconductor laser via an insulating film to control the temperature of an active layer. As shown by arrows with thick lines, since the heat generated by the heater layer escapes into not only the active layer but also a buried layer, the active layer cannot be efficiently heated. It is therefore a problem that the wavelength tuning efficiency, that is, the wavelength fluctuation range per unit power in the wavelength tunable semiconductor laser is as low as 3.2 nm/W.

SUMMARY OF THE INVENTION

It is therefore a main object of the invention to realize a wavelength tunable laser capable of tuning a wavelength over a wide range by simple means.

It is another object of the invention to realize a wavelength-division multiplexing transmission system which achieves the object and is suitable for a long distance transmission by using the wavelength tunable laser.

In order to achieve the objects, a wavelength tunable laser according to the invention is formed by mounting a thin film heater layer over and/or on a side of an upper electrode of a ridge waveguide semiconductor laser on a semiconductor substrate. The ridge waveguide semiconductor laser is obtained by forming a waveguide constructing a semiconductor laser in a ridge shape on a semiconductor substrate including a light emitting layer. The cross section of the ridge can have a shape of rectangle, trapezoid, or the like. An inverse trapezoid (inverse mesa) shape in which the side in contact with the semiconductor substrate is narrower than the upper side is preferable.

One of optical devices according to the invention is an integrated optical device in which the wavelength tunable laser and an external optical modulator are integrated on a semiconductor substrate of the wavelength tunable laser.

Further, another optical device according to the invention constructs a wavelength-division multiplexing transmission system for multiplexing light signal of a plurality of channels of different wavelengths and transmitting the light signal through a light transmission line. One or more wavelength tunable lasers are used as spare light source(s) of the plurality of light sources of the plurality of channels. When one of the light sources of the channels becomes faulty or the like and has to be replaced, the spare light source is allowed to operate and its wavelength is made coincide with the wavelength of the light source of the channel to be replaced by using the wave tuning function of the wavelength tunable laser.

The wavelength tunable laser of the invention enables the heat generated by the thin film heater to be efficiently applied to the light emitting part of the semiconductor laser. A monolithic integrated device is formed by combining the wavelength tunable laser with an optical modulator to thereby provide each of many optical devices such as a wavelength-division multiplexing transmission system with the effective means.

These and other objects, features and advantages of the present invention will become more apparent in view of the following description of the preferred embodiments in conjunction with accompanying drawings.

BRIEF DESCRIPTION OF THE DRAWINGS

FIG. 7 is a perspective view for explaining an embodiment of a spare light source corresponding to a spare light source 507 in FIG. 6 or the like.

DESCRIPTION OF THE PREFERRED EMBODIMENTS

Embodiment 1

Figure 1A:
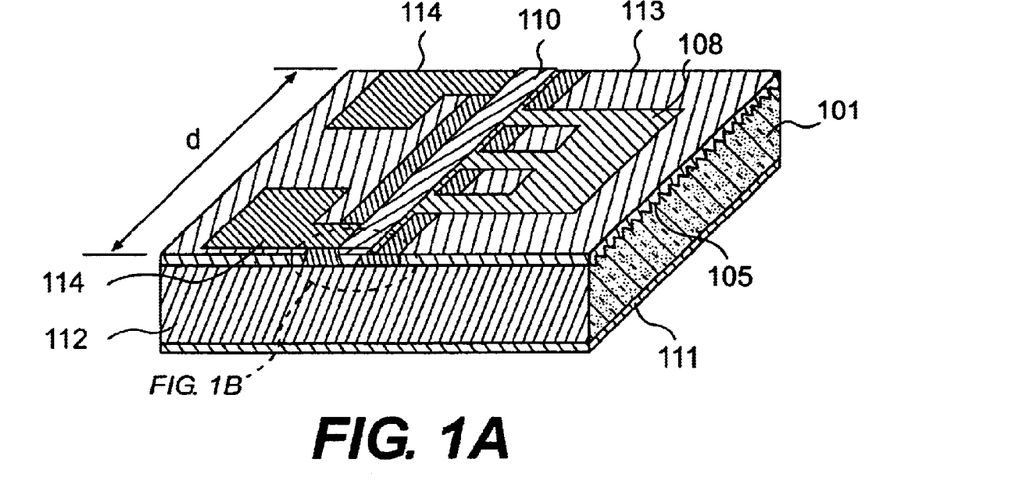
FIG. 1A is a perspective view showing the structure of a monolithic integrated optical device as an embodiment of a wavelength tunable laser according to the invention.

FIG. 1A is a perspective view showing the configuration of a monolithic integrated optical device as an embodiment of a wavelength tunable laser according to the invention. The cross sectional configuration of the main part of the embodiment is shown in an enlarged diagram FIG. 1B.

Figure 1B:
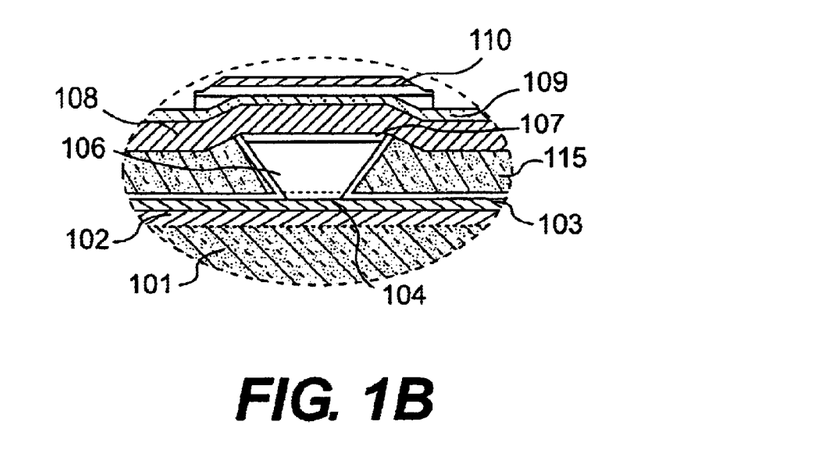
FIG. 1B shows an enlarged portion of FIG. 1A.

In the wavelength tunable laser, a buffer layer 102 and an active layer 103 are formed on a semiconductor substrate 101 and a ridge waveguide which includes a cladding layer 106 and a cap layer 107 and has an inverse mesa shape is formed. On the active layer 103, polyimide as a nonconductor 115 is formed via $SiO_2$ on both sides of the ridge waveguide. Further, an upper electrode 108 of a semiconductor laser is formed on the ridge waveguide and a thin film heater 110 is mounted over the upper electrode 108 via an insulating film 109.

An embodiment of a method of fabricating the wavelength tunable laser will be described hereinbelow. On an n type (100) InP semiconductor substrate 101, 1.0 μm of an n type InP buffer layer 102, the active layer 103, and 0.02 μm of a first p type InP cladding layer 104 are sequentially deposited by metalorganic vapor-phase epitaxy. The active layer 103 has 0.05 μm of an n type InGaAsP lower guide layer (composition wavelength of 1.10 μm), a multiple quantum well layer of 5 cycles (a well layer made of InGaAsP having a thickness of 6.0 nm and compressive strain of 1% (composition wavelength of 1.70 μm) and a barrier layer made of InGaAsP having a thickness of 10 nm (composition wavelength of 1.15 μm)) and 0.05 μm of an upper guide layer made of InGaAsP (composition wavelength of 1.15 μm). The wavelength of light emitted from the multiple quantum well active layer 103 is about 1.56 μm.

A grating 105 of uniform cycles of 241 nm is formed on the whole face of the substrate by holographic photolithography and wet etching. The depth of the grating is about 50 nm. Subsequently, 1.7 μm of the second p type InP cladding layer 106 and 0.2 μm of a highly doped p type InGaAs cap layer 107 are formed by metalorganic vapor-phase epitaxy.

Subsequently, a process is performed to obtain an inverse-mesa ridge waveguide type laser structure having the width of about 2.0 μm and, after that, the upper electrode 108 is formed. The upper electrode 108 for laser driving is patterned and the silicon oxide film 109 having a thickness of 200 nm is formed on the entire face. Further, the platinum thin film heater 110 having a width of about 10 μm and a thickness of 300 nm is formed only over the ridge waveguide by electron beam evaporation, photolithography, and ion million. Au heater electrode pads 114 for connection are connected to both ends of the platinum thin film heater 110.

Finally, after opening a window in the upper electrode 108 for laser driving, a lower electrode 111 is formed. The resultant is cut by a cleavage process into devices each having a length of d=400 μm, a low reflecting film 112 of about 1% of reflectance is formed on the front end face of the device and a high reflecting film 113 of about 90% of reflectance is formed on the rear end face by a known method.

A distributed feedback semiconductor laser device in a 1.55 μm band fabricated by the above fabricating method is mounted on a heat sink (not shown) using a silicon carbide material and the upper electrode 108 for laser driving and the heater electrode are wired.

Figure 2:
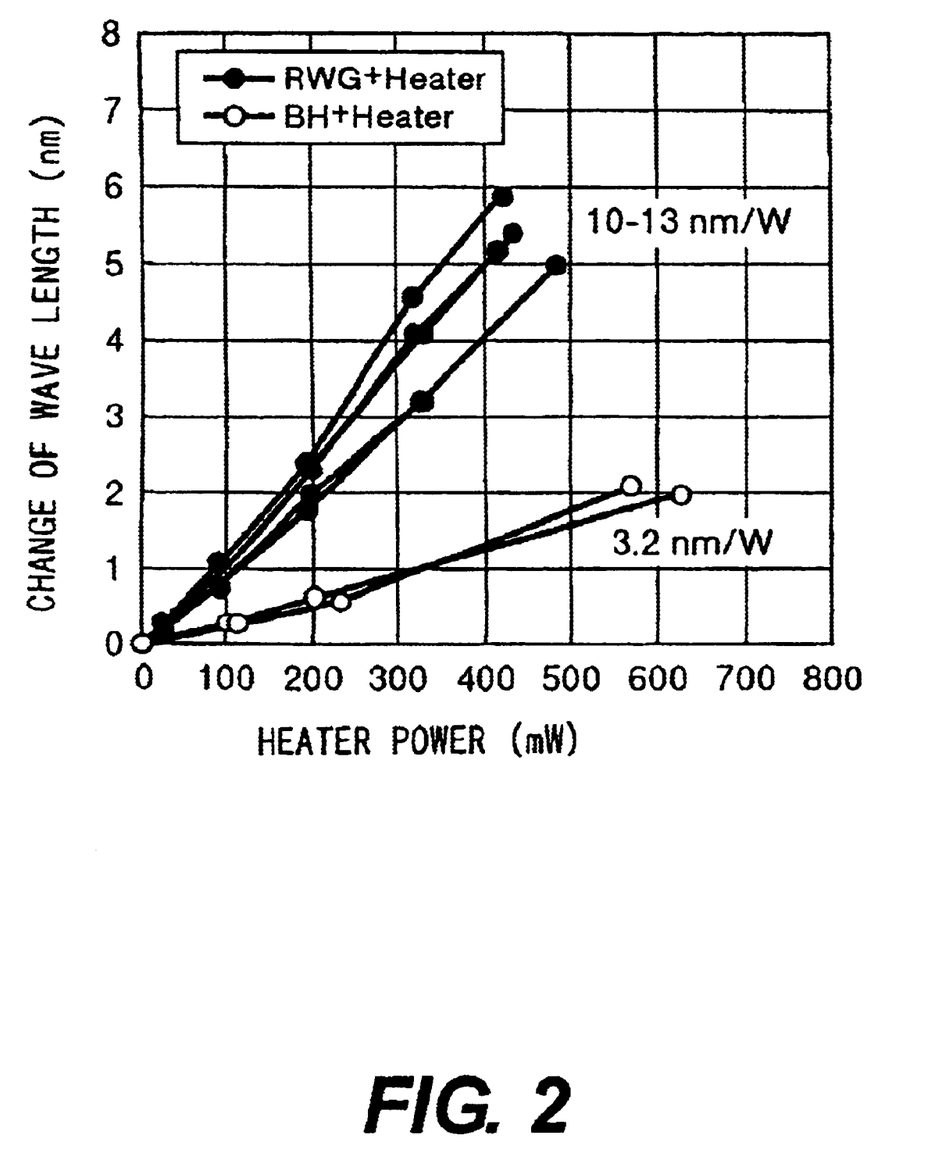
FIG. 2 shows the result of measurement of the wavelength tuning characteristic of the wavelength tunable laser according to an embodiment of the present invention.

FIG. 2 shows the result of measurement of the wavelength tuning characteristic of the wavelength tunable laser according to the embodiment. In the graph, the lateral axis denotes power consumption (mW) of the heater 110 and the vertical axis denotes a change value (nm) of the wavelength. In the graph, black dots indicate the embodiment and blank dots show the conventional technique shown in FIG. 9. The measurement is carried out under the condition that the heat sink temperature is set at 20 degrees centigrade and the heater current passing through the heater 110 is changed in a range from 0 to 100 mA. As understood from the measurement result, by changing the heater current within the range from 0 to 100 mA, the wavelength tuning range of 5 nm or larger is obtained. In this case, the wavelength tuning efficiency of about 10 nm/W that is about 10 times as high as the conventional one is obtained. Since the temperature coefficient of the lasing wavelength of the laser is 0.11 nm/deg., the temperature of the laser active layer is heated to 20 to 57 degrees centigrade. In this case, the laser driving current necessary for a constant output of 10 mW changes from 50 mA to 70 mA. An increase is therefore suppressed to only 20 mA.

On the other hand, the longitudinal mode of the distributed feedback laser during sweeping of the wavelength by the current is stable, so that complete continuous wavelength sweeping is realized without mode hopping since the reflectance of the laser cavity uniformly changes by the heating and, in principle, there is no change in the longitudinal mode.

In the embodiment, as mentioned above, since the characteristic fluctuation at the time of high temperature is smaller as compared with the conventional buried hetero structure semiconductor laser shown in FIG. 9, the ridge waveguide structure semiconductor laser has an advantage such that the laser characteristic deterioration at the time of heating of the heater is a little. Since heat generated by the heater 110 does not easily escape to the polyimide portion 104, the active layer can be efficiently heated via the ridge section. Consequently, the wavelength tuning operation can be realized with a smaller amount of power consumption.

The wavelength tunable laser on which the heater having the multiple quantum well active layer made of InGaAsP is mounted has been described in the embodiment. When the laser has an active layer made of another material such as InGaAlAs or GaInNAs having an excellent characteristic at high temperature, the high temperature characteristic of the active layer is more excellent than that of the InGaAsP material laser of the embodiment. Consequently, the wavelength sweep can be realized over a wider range.

In the structure of the embodiment, by passing the current to the heater electrode, the laser active layer is heated to change the reflectance. Thus, the lasing wavelength of the distributed feedback laser can be changed over a wide range.

Embodiment 2

Figure 3A:
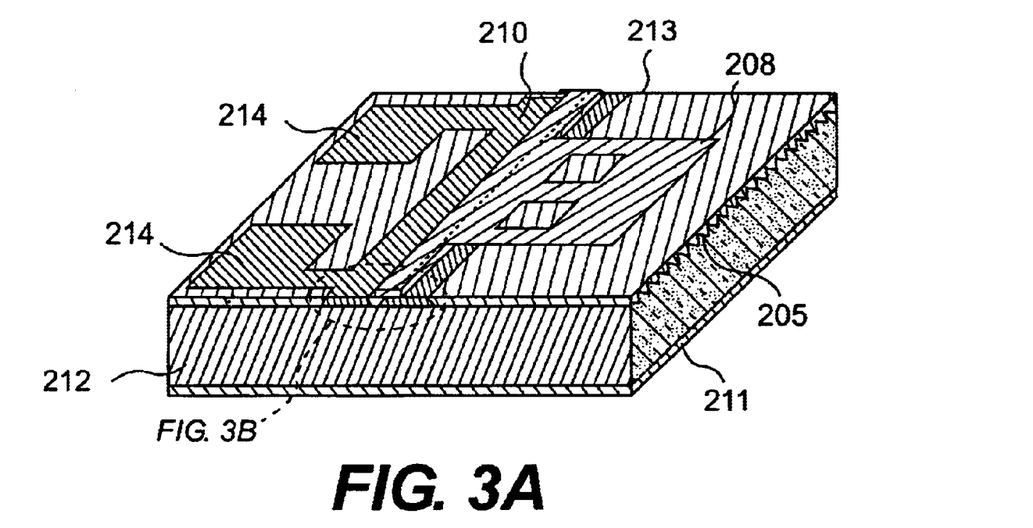
FIG. 3A is a perspective view showing the structure of a monolithic integrated optical device constructing an optical modulator as an embodiment of an optical device using the wavelength tunable laser according to the invention.
Figure 3B:
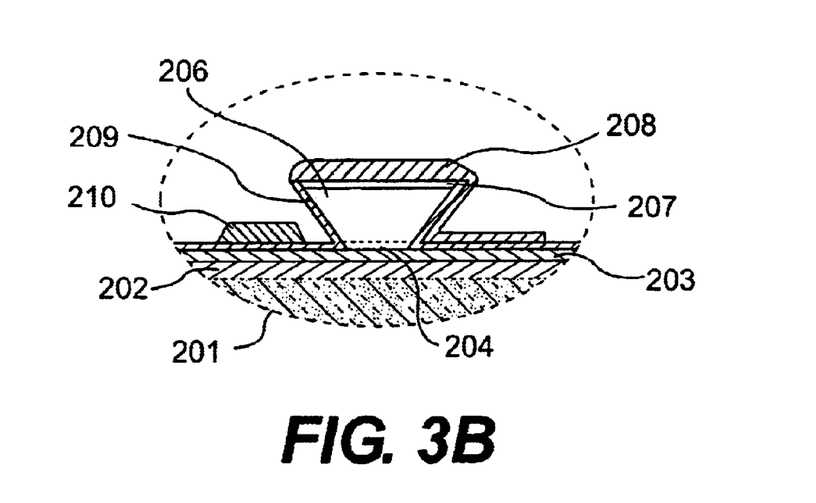
FIG. 3B shows an enlarged portion of FIG. 3A.

FIG. 3A is a perspective view showing the configuration of a monolithic integrated optical device as another embodiment of the wavelength tunable laser according to the invention. The cross sectional configuration of the main part of the embodiment is shown in an enlarged diagram FIG. 3B. The different point from the embodiment shown in FIGS. 1A and 1B is the position of the heater electrode. In the second embodiment, a heater electrode 210 is formed over an active layer 203 via a silicon oxide film 209 on a side of the ridge waveguide. The ridge waveguide and the heater electrode 210 are provided so as to have a predetermined gap and a nonconductor is removed. The other structure is substantially the same as that of FIGS. 1A and 1B. Specifically, 1.0 μm of an n type InP buffer layer 202, an active layer 203, and a first p type InP cladding layer 204 are sequentially formed on an n type (100) InP semiconductor substrate 201.

The device has a grating 205 formed on the entire face of the substrate, a second p type InP cladding layer 206, a highly doped p type InGaAs cap layer 207, an inverse mesa ridge guide laser structure, an upper electrode 208, and a silicon oxide film 209. Au heater electrode pads 214 for wiring are connected to both ends of the platinum thin film heater 210. A low reflecting film 212 of reflectance of about 1% is formed on the front end face of the integrated device and a high reflecting film 213 of reflectance of about 90% is formed on the rear end face. The embodiment has also the inverse mesa ridge waveguide shown in FIGS. 1A and 1B and can realize the wavelength tuning characteristic in a manner similar to the first embodiment.

Embodiment 3

Figure 4A:
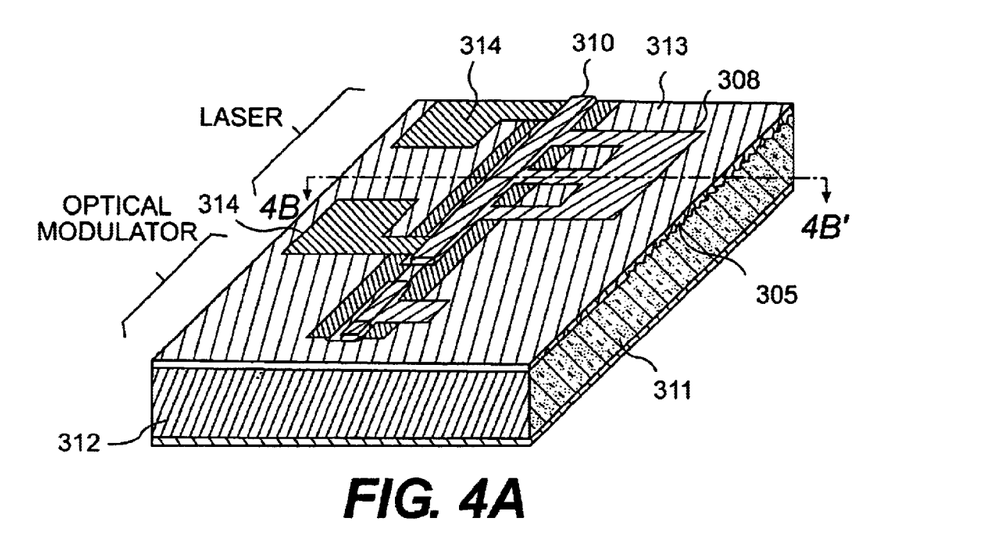
FIG. 4A is a perspective view showing the structure of a monolithic integrated optical device constructing an optical modulator as an embodiment of an optical device using the wavelength tunable laser according to the invention.

FIG. 4A is a perspective view showing the configuration of a monolithic integrated optical device constructing an optical modulator as an embodiment of an optical device using the wavelength tunable laser according to the invention. The cross sectional configuration of the main part of the embodiment is shown in an enlarged diagram FIG. 4B.

Figure 4B:
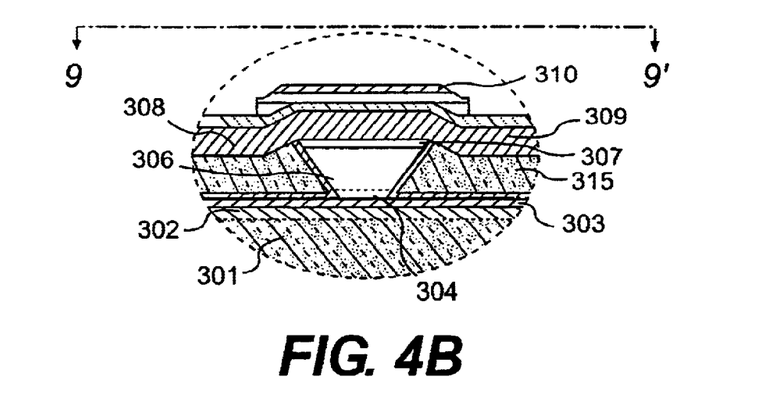
FIG. 4B shows an enlarged portion of FIG. 4A.

In the embodiment, a wavelength tunable laser of the operating principle similar to that of the embodiment 1 and an electro-absorption optical modulator are monolithic integrated. On an n type (100) InP semiconductor substrate 301, an n type InP buffer layer 302, an active layer 303, and a first p type InP cladding layer 104 are sequentially deposited. The active layer 303 comprises 0.05 μm of an n type InGaAsP lower guide layer (composition wavelength of 1.10 μm), a multiple quantum well layer of 5 cycles (a well layer made of InGaAsP having a thickness of 6.0 nm and compressive strain of 1% (composition wavelength of 1.70 μm) and a barrier layer made of InGaAsP having a thickness of 10 nm (composition wavelength of 1.15 μm), and 0.05 μm of an upper guide layer made of InGaAsP (composition wavelength of 1.15 μm). A grating 305 of uniform cycles of 241 nm is formed on the whole face of the substrate.

Subsequently, a second p type InP cladding layer 306 and a highly doped p type InGaAs cap layer 307 are formed. Further, a process is performed to obtain an inverse mesa ridge waveguide laser structure having a width of about 2.0 μm and, after that, an upper electrode 308 is formed. On the upper electrode 308, a silicon oxide film 309 is formed on the entire face. A platinum thin film heater 310 is formed only over the ridge waveguide. Au heater electrode pads 314 for connection are connected to both ends of the platinum thin film heater 310. After opening a window in the upper electrode 308 for laser driving, a lower electrode 311 is formed. A low reflecting film 312 of about 1% of reflectance is formed on the front end face of the device and a high reflecting film 313 of about 90% of reflectance is formed on the rear end face. An enlarged diagram shows a cross section of the semiconductor layer of the main part taken along line X–X'.

In the embodiment, an electro-absorption optical modulator is formed on the InP semiconductor substrate 301. The interval of 150 μm or more is provided between the wavelength tunable laser and the electro-absorption optical modulator. It is designed so that heat applied into the laser at the time of tuning the wavelength does not reach the optical modulator. In a manner similar to the first embodiment, the basic lateral structure is a known inverse mesa ridge waveguide laser in which polyimide is embedded such that a nonconductor 315 such as polyimide is formed on both sides of the ridge waveguide. According to the third embodiment, when the oscillation wavelength is 1550 to 1554 nm and the current of heating is changed from 0 to 100 mA, 4 nm of the wavelength tuning width is obtained. When the wavelength is tuned, a stable long distance transmission characteristic is obtained at 10 gigabits per second within the wave sweeping range of 4 nm since the change in the chirping characteristic of the electro-absorption optical modulator is slight in the wavelength range of about 4 nm.

Embodiment 4

Figure 5:
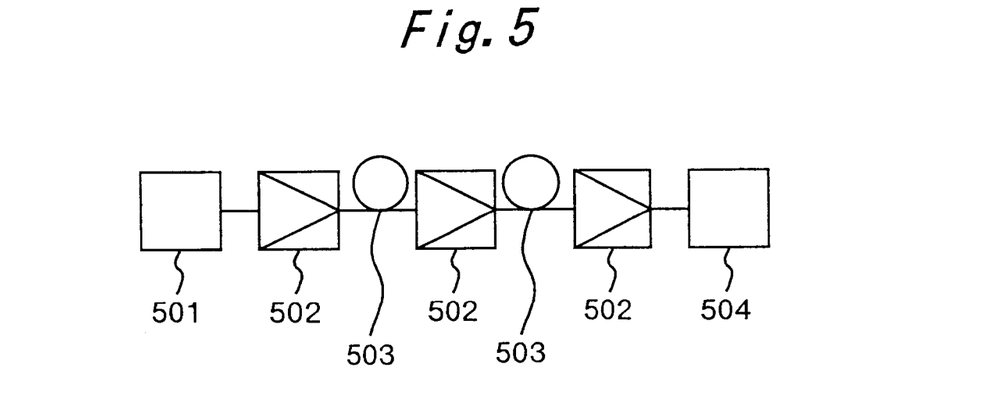
FIG. 5 is a system configuration diagram showing the configuration of a wavelength-division multiplexing optical system to which a wavelength tunable laser according to the invention is applied.
Figure 6:
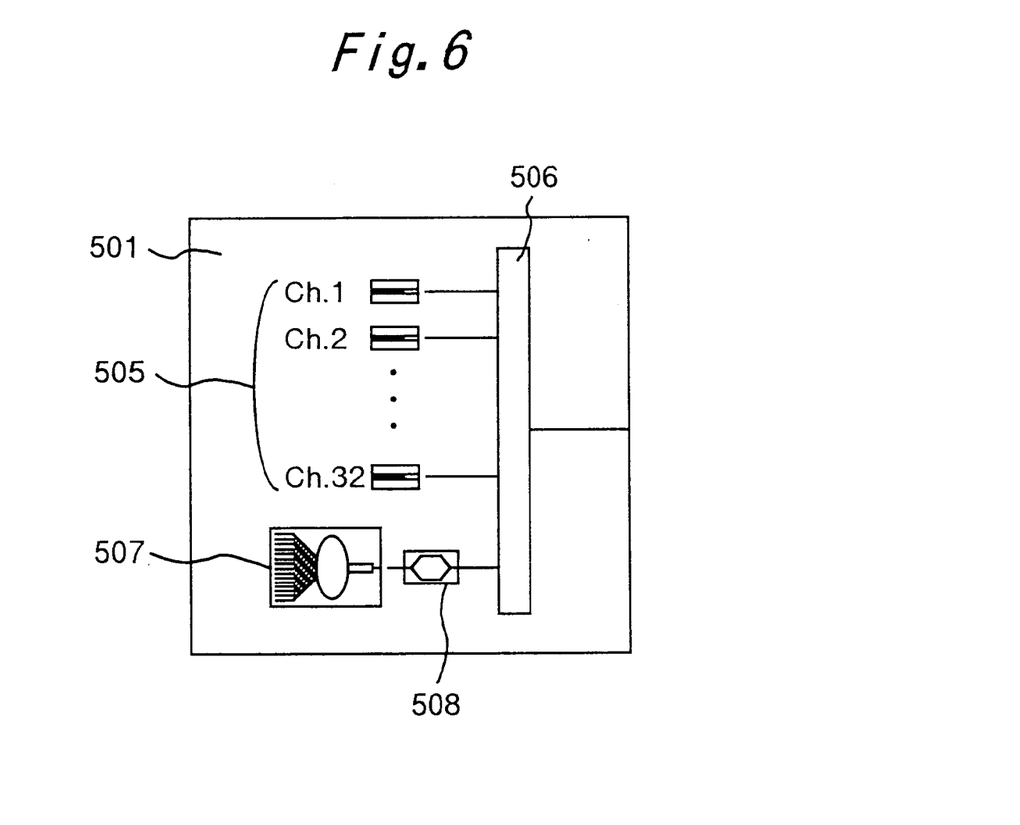
FIG. 6 is a block diagram showing the configuration of the main part of FIG. 5.

FIGS. 5 and 6 are a system configuration diagram and a diagram showing the configuration of the main section of a wavelength-division multiplexing transmission system using the wavelength tunable laser according to the invention.

Light signals of a plurality of channels whose wavelengths are multiplexed, which are generated by a wavelength-division multiplexing transmission system 501 according to the invention are amplified by a fiber amplifier 502 and the amplified signals are transmitted through an optical fiber 503 for transmission and demodulated by an optical receiver 504 via an optical amplifier on the receiving side. As necessary, one or a plurality of optical amplifiers 502 for relay are provided in some midpoints in the optical fiber 503.

The wavelength-division multiplexing transmission system 501 is formed as a monolithic integrated device having optical devices of a plurality of light signal sources 505 of different wavelengths of a plurality of channels ch.1 to ch.32, a spare light source 507, a Mach-Zehnder type optical modulator 508 for optical modulating an output of the spare light source 507, and an optical multiplexer 506 for multiplexing output light of the light signal sources 505 and the modulator 508. The wavelength set in the light signal source 505 is 1534.25 nm to 1558.98 nm and the wavelength interval is set to 100 GHz. A single spare light source 507 covers the entire wavelength range from 1534.25 nm to 1558.98 nm.

The light output of the spare light source 507 is led to the Mach-Zehnder type optical modulator 508 which is a single waveguide optical modulator and is made of lithium niobate, and subjected to high-speed optical modulation. Since the modulation characteristic hardly fluctuates according to the operation wavelength in the Mach-Zehnder type optical modulator 508, laser beams of different wavelengths from the spare light source 507 are modulated with the same chirping characteristic. According to the embodiment, when a fault occurs in any of the main light sources 505 of 32 channels, by setting the wavelength of the spare light source 507 to the wavelength of the faulty light source, the function of the wavelength-division multiplexing transmission system is recovered at high speed. All of the channels can be backed up by the single spare light source 507, the single Mach-Zehnder type optical modulator 508, and a single driver. Consequently, as compared with the conventional configuration in which spare parts are prepared for each of the channels, the miniaturization of the system and the cost reduction are greatly improved.

Embodiment 5

Figure 7:
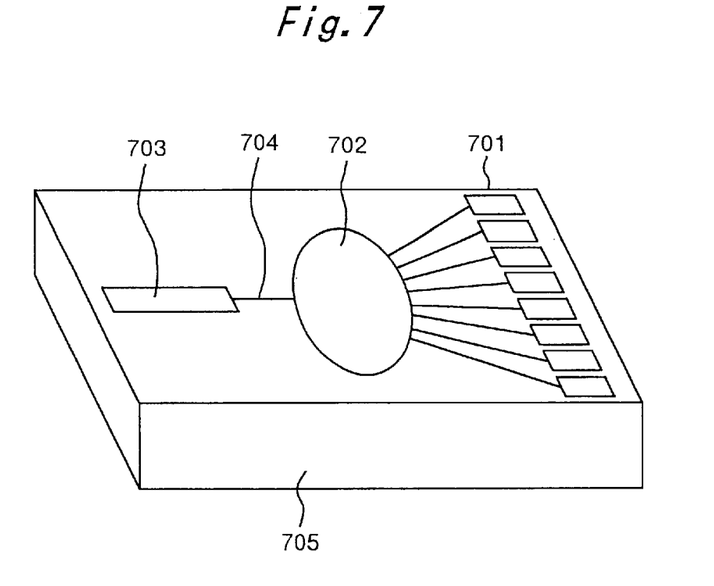

FIG. 7 is a perspective view for explaining an embodiment of a spare light source corresponding to the spare light source 507 in FIG. 6 or the like. In the embodiment, eight distributed feedback semiconductor lasers 701 are monolithic integrated on a semiconductor integrated substrate 705. Output light of the semiconductor lasers 701 are converged to an outgoing waveguide 704 by a known optical multiplexer 702 integrated on the same substrate 705. A semiconductor light amplifier 703 is connected to the outgoing waveguide 704 to compensate a multiplexing loss. The oscillation wavelength of each of the eight distributed feedback semiconductor lasers 701 is set to a range from 1530 to 1562 nm and the ranges are set at intervals of 4 nm by controlling a grating cycle and a gain peak wavelength of each of the lasers 701 in accordance with a known method. The configuration of the semiconductor laser 701 is according to the embodiment shown in FIG. 1. When the carrier temperature of the semiconductor laser 701 was set to 20 degrees centigrade and the current of heating was changed in a range from 0 to 100 mA, the wavelength tuning width of 4 nm was realized.

Embodiment 6

Figure 8:
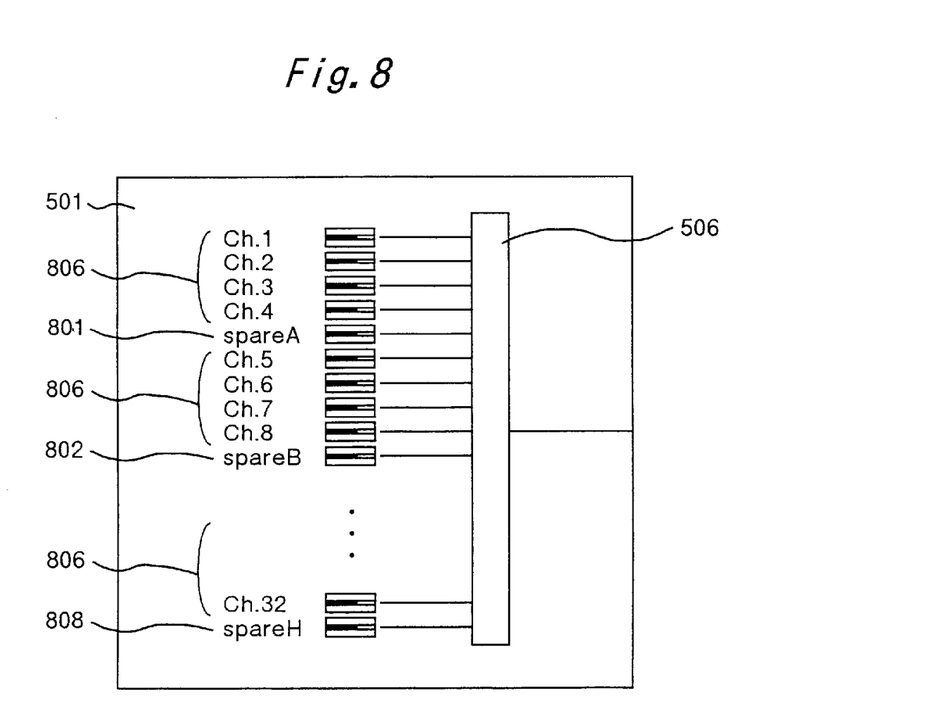
FIG. 8 is a block diagram showing another embodiment of a wavelength-division multiplexing transmission system.

FIG. 8 is a block diagram showing another embodiment of the wavelength-division multiplexing transmission system. In the embodiment shown in FIG. 6, only one spare light source 507 is provided. In the sixth embodiment, a plurality of channels ch.1 to ch. 33 are divided into eight groups 805 each having four channels of close wavelengths and spare light sources 801 to 808 are provided for the eight groups, respectively. The other configuration and operation are similar to those of FIG. 6.

The wavelength tunable laser according to the invention can realize the wide wavelength tuning range and the wave tuning efficiency a few times as high as that of the known conventional buried hetero structure semiconductor laser by the simple configuration of using the ridge structure semiconductor laser. By monolithic integrating the wavelength tunable laser and the optical modulator and assembling the integrated device to a communication system, a high-reliability high-quality wavelength-division multiplexing transmission system can be realized. Further, a very reliable optical transmitter capable of continuously tuning the wavelength of a transmission signal can be easily realized at low manufacturing cost.

What is claimed is:

1. A wavelength tunable laser comprising:

a ridge waveguide semiconductor laser having a set of layers including an active layer and formed on a semiconductor substrate, a ridge waveguide including a cladding layer and a cap layer and mounted on said set of layers, a driving electrode formed on a top surface of the ridge waveguide, and a nonconductor provided on both sides of the ridge waveguide;

an insulating layer formed on the driving electrode and on the nonconductor;

a thin film heater mounted on the insulating layer and over the driving (upper) electrode; and a terminal for supplying a current to the thin film heater.

2. A wavelength tunable laser according to claim 1, wherein said nonconductor is polyimide.

3. A wavelength tunable laser comprising:

a ridge waveguide semiconductor laser having a set of layers formed on a semiconductor substrate, a ridge waveguide mounted on said set of layers and including a cladding layer and a cap layer, a driving electrode formed on a top surface of the ridge waveguide;

an insulating layer formed on said set of layers and on at least one side of the ridge waveguide;

a thin film heater mounted on the insulating layer near a bottom portion of the ridge waveguide; and a terminal for supplying a current to the thin film heater.

4. A wavelength tunable laser according to claim 1, wherein the cross section of the ridge waveguide has an inverse mesa shape in which the substrate side is narrow and the upper side is wide.

5. A wavelength tunable laser according to claim 1, wherein the ridge waveguide semiconductor laser is an edge emitting type semiconductor laser of either a distributed feedback type or distributed reflection type for emitting unmodulated light.

6. A wavelength tunable laser according to claim 1, wherein the material of an active layer in the edge emitting type semiconductor laser contains InGaAsP, InGaAlAs or GaInNAs.

7. An optical device in which a waveguide optical modulator for modulating output light of the semiconductor laser is integrated on a semiconductor substrate of a wavelength tunable laser according to claim 1.

8. A wavelength-division multiplexing transmission system for transmitting light signals of different wavelengths of a plurality of channels through the same optical transmission line, comprising a plurality of first light sources for the plurality of channels, a spare light source for the first light sources, a Mach-Zehnder type optical modulating unit for modulating output light of the spare light source, wherein said spare light source is formed of a wavelength tunable laser having;

a ridge waveguide semiconductor laser having a ridge waveguide;

a set of layers including active layer and formed on a semiconductor substrate, a ridge waveguide including a cladding layer and a cap layer and mounted on said set of layers, a driving electrode formed on top surface of the ridge waveguide, and a nonconductor formed on both sides of the ridge waveguide;

an insulating layer formed on the driving electrode and on the nonconductor;

a thin film heater mounted on the insulating layer and over the driving (upper) electrode; and a terminal for supplying a current to the thin film heater.

9. A wavelength tunable laser according to claim 3, wherein the cross section of the ridge waveguide has an inverse mesa shape in which the substrate side is narrow and the upper side is wide.

10. A wavelength tunable laser according to claim 3, wherein the ridge waveguide semiconductor laser is an edge emitting type semiconductor laser of either a distributed feedback type or distributed reflection type for emitting unmodulated light.

11. A wave tunable laser according to claim 3, wherein the material of an active layer in the edge emitting type semiconductor laser contains InGaAsP, InGaAlAs or GaInNAs.

12. An optical device in which a waveguide optical modulator for modulating output light of the semiconductor laser is integrated on a semiconductor substrate of a wave tunable laser according to claim 3.

* * * * *